United States Patent
Lin et al.

(10) Patent No.: US 9,798,982 B2
(45) Date of Patent: Oct. 24, 2017

(54) DETERMINING A NUMBER OF KERNELS USING IMBALANCED TRAINING DATA SETS

(71) Applicant: International Business Machines Corporation, Armonk, NY (US)

(72) Inventors: Ching-Yung Lin, Scarsdale, NY (US); Wan-Yi Lin, White Plains, NY (US); Yinglong Xia, Rye Brook, NY (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 14/831,434

(22) Filed: Aug. 20, 2015

(65) Prior Publication Data

US 2015/0356464 A1  Dec. 10, 2015

Related U.S. Application Data

(63) Continuation of application No. 14/034,797, filed on Sep. 24, 2013, now Pat. No. 9,224,104.

(51) Int. Cl.
*G06F 15/18* (2006.01)
*G06N 99/00* (2010.01)
*G06F 17/50* (2006.01)

(52) U.S. Cl.
CPC .......... *G06N 99/005* (2013.01); *G06F 17/50* (2013.01)

(58) Field of Classification Search
None
See application file for complete search history.

(56) References Cited

U.S. PATENT DOCUMENTS

| | | |
|---|---|---|
| 6,269,376 B1 | 7/2001 | Dhillon et al. |
| 7,480,667 B2 | 1/2009 | Harr et al. |
| 7,558,764 B2 | 7/2009 | Abe et al. |
| 7,949,622 B2 | 5/2011 | Sellamanickam et al. |
| 2005/0228783 A1 | 10/2005 | Shanahan et al. |
| 2009/0097741 A1 | 4/2009 | Xu et al. |
| 2012/0089552 A1 | 4/2012 | Chang et al. |

(Continued)

OTHER PUBLICATIONS

Bouman, "CLUSTER: An Unsupervised Algorithm for Modeling Gaussian Mixtures", 1997, pp. 20 https://engineering.purdue.edu/~bouman/software/cluster/manual.pdf.*

(Continued)

*Primary Examiner* — Li-Wu Chang
(74) *Attorney, Agent, or Firm* — Yee & Associates, P.C.; Daniel P. Morris

(57) ABSTRACT

Determining a number of kernels within a model is provided. A number of kernels that include data samples of a majority data class of an imbalanced training data set is determined based on a set of generated artificial data samples for a minority data class of the imbalanced training data set. The number of kernels within the model is generated based on the set of generated artificial data samples. A likelihood of the set of generated artificial data samples being included in the majority data class of the imbalanced training data set is calculated. Parameters of each kernel in the number of kernels are updated based on the likelihood of the set of generated artificial data samples being included in the majority data class of the imbalanced training data set. Each kernel in the number of kernels is adjusted based on the updated parameters.

12 Claims, 6 Drawing Sheets

(56) References Cited

U.S. PATENT DOCUMENTS

2013/0097103 A1    4/2013   Chari et al.
2014/0257122 A1    9/2014   Ong et al.
2015/0088791 A1    3/2015   Lin et al.

OTHER PUBLICATIONS

Richardson, and Green, "On Bayesian analysis of mixtures with an unknown number of components", Journal of the Royal Statistical Society, Series B, 59, 1997, pp. 731-792.*

Chawla et al., "Editorial: Special Issue on Learning From Imbalanced Data Sets," ACM SIGKDD Explorations Newsletter, vol. 6, No. 1, Jun. 2004, pp. 1-6.

Chawla et al., "SMOTE: Synthetic Minority Over-sampling Technique," Journal of Artificial Intelligence Research, vol. 16, No. 1, Jan. 2002, pp. 321-357.

Chen et al., "A Novel Differential Evolution-Clustering Hybrid Resampling Algorithm on Imbalanced Datasets," Third International Conference on Knowledge Discovery and Data Mining (WKKD'10), Jan. 2010, pp. 81-85.

Cohen, "Fast Effective Rule Induction," Proceedings of the 12th International Conference on Machine Learning (ICML'95), Jul. 1995, pp. 115-123.

Curry et al., "Scaling Genetic Programming to Large Datasets Using Hierarchical Dynamic Subset Selection," IEEE Transactions on Systems, Man, and Cybernetics—Part B: Cybernetics, vol. 37, No. 4, Aug. 2007, pp. 1065-1073.

Esfandi, "Efficient Anomaly Intrusion Detection System in Adhoc Networks by Mobile Agents," 2010 3rd IEEE International Conference on Computer Science and Information Technology (ICCSIT), Jul. 2010, pp. 73-77.

Hong et al., "A Kernel-Based Two-Class Classifier for Imbalanced Data Sets," IEEE Transactions on Neural Networks, vol. 18, No. 1, Jan. 2007, pp. 28-41.

Klement et al., "Dealing with Severely Imbalanced Data," Proceedings of the PAKDD 2009 Workshop on Data Mining When Classes are Imbalanced and Errors Have Costs (ICEC '09), Apr. 2007, 12 pages.

Kotsiantis et al., "Mixture of Expert Agents for Handling Imbalanced Data Sets," Annals of Mathematics, Computing & Teleinformatics, vol. 1, No. 1, Jan. 2003, pp. 46-55.

Kubat et al., "Addressing the curse of imbalanced training sets: One sided selection," Proceedings of the 14th International Conference on Machine Learning (ICML '97), Jul. 1997, pp. 179-186.

Kumar et al., "Fast Parallel Expectation Maximization for Gaussian Mixture Models on GPUs Using CUDA," Proceedings of 11th IEEE International Conference on High Performance Computing and Communications (HPCC'09), Jun. 2009, pp. 103-109.

Muandet et al.. "One-Class Support Measure Machines for Group Anomaly Detection," Proceedings of the Conference on Uncertainty in Artificial Intelligence (UAI 2013), Jul. 2013,10 pages.

Raskutti et al., "Extreme Rebalancing for SVMs: a case study," ACM SIGKDD Explorations Newsletter, vol. 6, No. 1, Jun. 2004, pp. 60-69.

Tax et al., "Uniform Object Generation for Optimizing One-class Classifiers," Journal of Machine Learning Research, vol. 2, Dec. 2001, pp. 155-173.

Weiss, "Mining with Rarity: A Unifying Framework," ACM SIGKDD Explorations Newsletter, vol. 6, No. 1, Jun. 2004, pp. 7-19.

Xia et al., "Fault-Tolerant EM algorithm for GMM in Sensor Networks," Proceedings of the 2005 International Conference on Data Mining (DMIN 2005), Jun. 2005, pp. 166-172.

Yang et al., "Brain Activation Detection by Neighborhood One-class SVM," Proceedings of the 2007 IEEEIWIC/ACM International Conferences on Web Intelligence and Intelligent Agent Technology Workshops, Nov. 2007, pp. 47-51.

Zheng et al., "Feature Selection for Text Categorization on Imbalanced Data," ACM SIGKDD Explorations Newsletter, vol. 6, No. 1, Jun. 2004, pp. 80-89.

Notice of Allowance, dated Aug. 18, 2015, regarding U.S. Appl. No. 14/034,797, 18 pages.

* cited by examiner

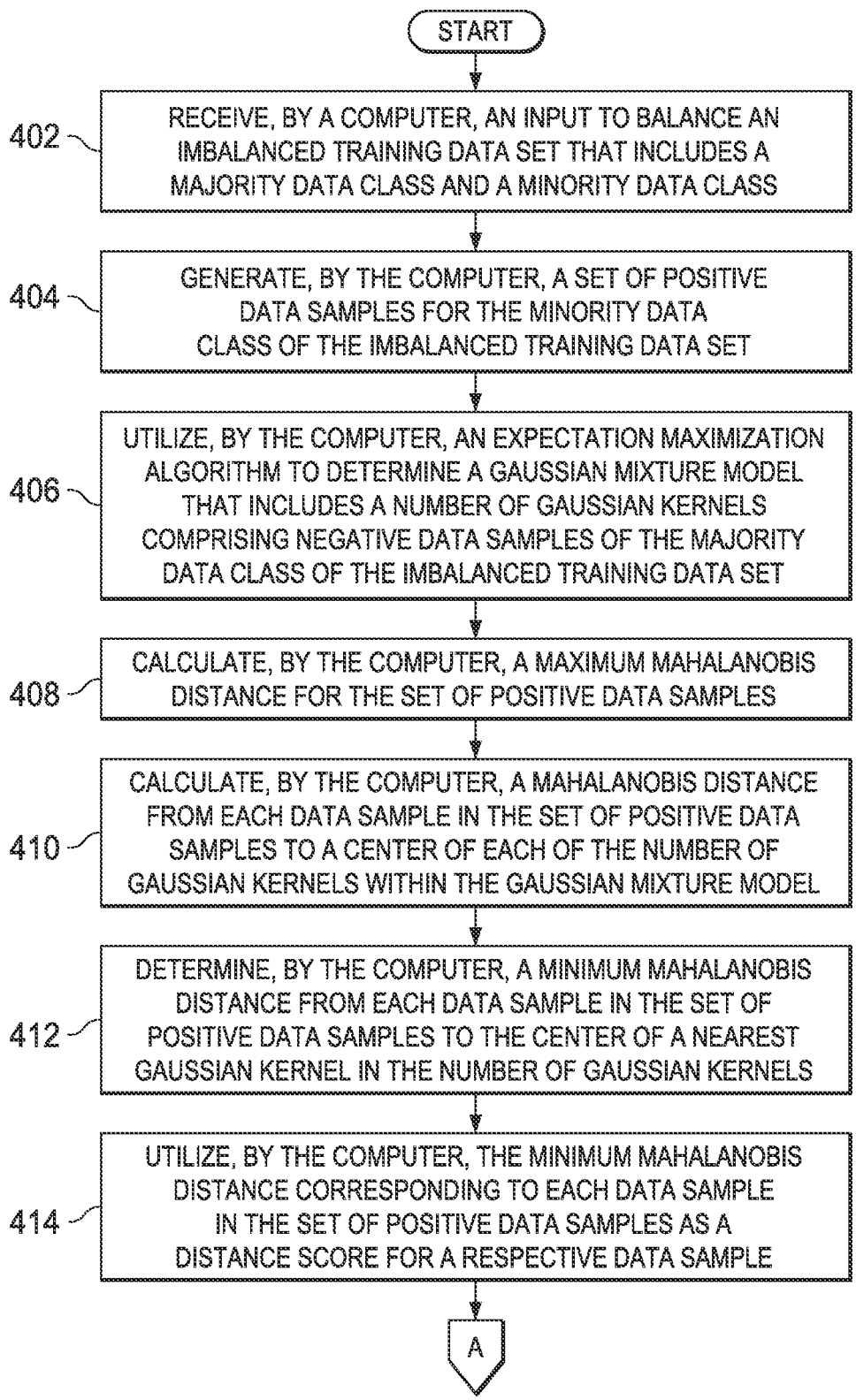

DETERMINING A NUMBER OF KERNELS USING IMBALANCED TRAINING DATA SETS

This application is a continuation of prior application Ser. No. 14/034,797, filed Sep. 24, 2013.

This invention was made with Government support under Contract No.: W911NF-11-C-0200 (Defense Advanced Research Projects Agency (DARPA)). The Government has certain rights in this invention.

BACKGROUND

1. Field

The disclosure relates generally to supervised machine learning and more specifically to generating artificial data samples for a minority data class from an imbalanced training data set to train a multi-class classifier model of a supervised machine learning program.

2. Description of the Related Art

Supervised machine learning programs require training data that includes different classes of data to train multi-class classifier models. Supervised learning is the machine learning task of inferring a function from labeled training data. A supervised machine learning program analyzes the training data and generates an inferred function, which is used for mapping new examples. In supervised machine learning, multi-class classification is the problem of classifying data into two or more classes. Unfortunately, in many real world applications, the available training data set is highly imbalanced, that is, one class of data in the available training data set is very sparse or non-existent. In other words, a training data set is imbalanced if the data classes are not equally represented (i.e., one data class (a minority class) includes a smaller number of examples than other data classes in the training data set. For example, in anomaly detection systems or diagnosis systems, anomalous data may be extremely difficult to collect, mainly due to the rare occurrence of such abnormal events. Data class imbalance creates difficulties for supervised machine learning programs and decreases classifier performance. Consequently, training a multi-class classifier model using a highly imbalanced training data set results in ignorance of a minority data class.

SUMMARY

According to one illustrative embodiment, a computer-implemented method for determining a number of kernels within a model is provided. A computer determines a number of kernels that include data samples of a majority data class of an imbalanced training data set based on a set of generated artificial data samples for a minority data class of the imbalanced training data set. The computer generates the number of kernels within the model based on the set of generated artificial data samples. The computer calculates a likelihood of the set of generated artificial data samples being included in the majority data class of the imbalanced training data set. The computer updates parameters of each kernel in the number of kernels based on the likelihood of the set of generated artificial data samples being included in the majority data class of the imbalanced training data set. The computer adjusts each kernel in the number of kernels based on the updated parameters. According to other illustrative embodiments, a computer system and a computer program product for determining a number of kernels within a mode also are provided.

BRIEF DESCRIPTION OF THE SEVERAL VIEWS OF THE DRAWINGS

FIGS. 4A-4B are a flowchart illustrating a process for injecting generated data samples into a minority data class to balance an imbalanced training data set in accordance with an illustrative embodiment.

DETAILED DESCRIPTION

Figure 1:
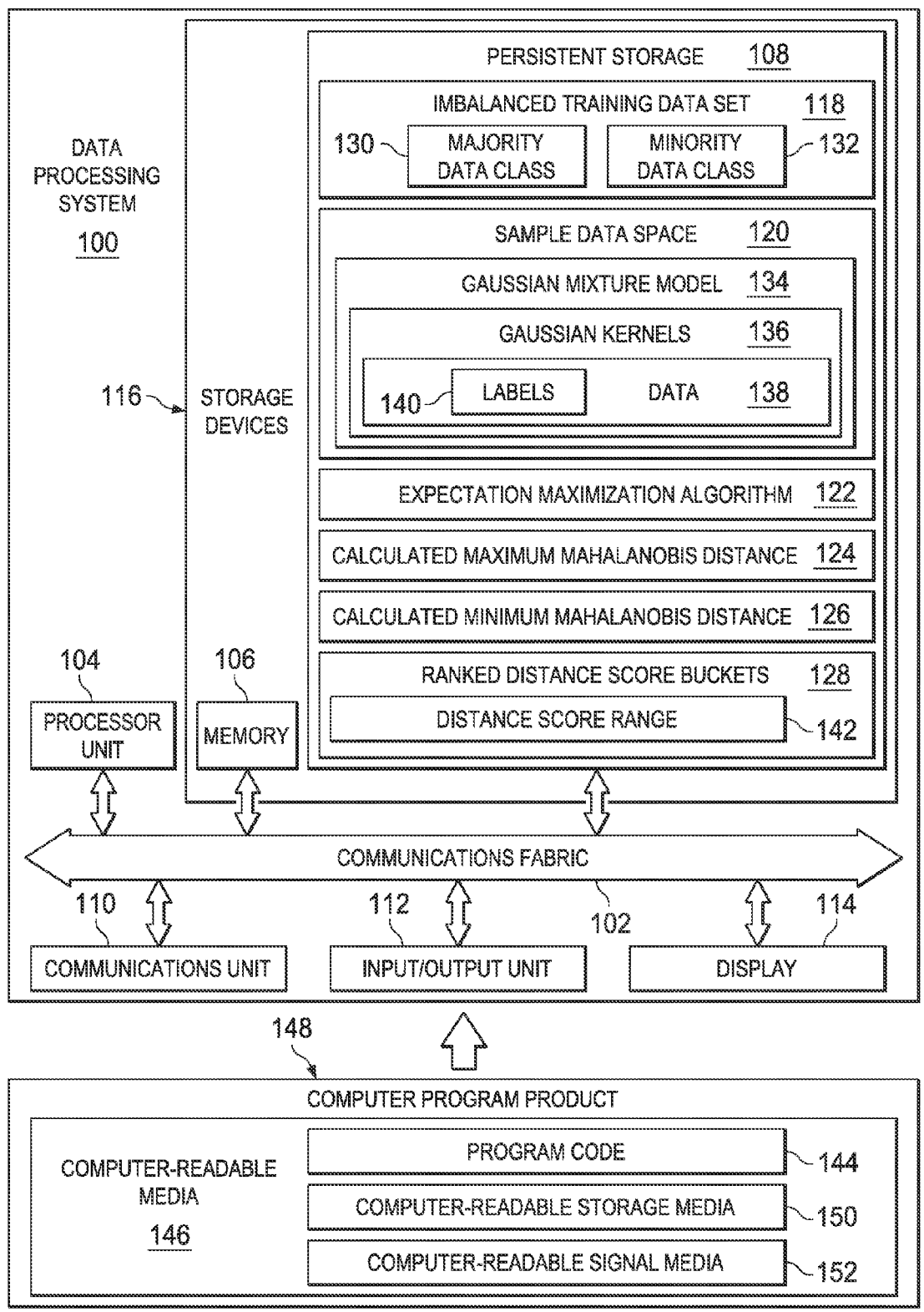
FIG. 1 is a diagram of a data processing system in which illustrative embodiments may be implemented.

As will be appreciated by one skilled in the art, aspects of the illustrative embodiments may be embodied as a computer system, computer-implemented method, or computer program product. Accordingly, aspects of the illustrative embodiments may take the form of an entirely hardware embodiment, an entirely software embodiment (including firmware, resident software, micro-code, etc.), or an embodiment combining software and hardware aspects that may all generally be referred to herein as a "circuit," "module," or "system." Furthermore, aspects of the illustrative embodiments may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can store a program for use by or in connection with an instruction execution system, apparatus, or device. In addition, a computer readable storage medium does not include a propagation medium, such as a signal or carrier wave.

A computer readable signal medium may include a propagated data signal with computer readable program code embodied therein, for example, in baseband or as part of a carrier wave. Such a propagated signal may take any of a variety of forms, including, but not limited to, electro-magnetic, infra-red, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the illustrative embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the illustrative embodiments are described below with reference to flowchart illustrations and/or block diagrams of computer-implemented methods, computer systems, and computer program products according to illustrative embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable storage medium that can direct a computer, other programmable data processing apparatus, or other devices to function in a particular manner, such that the instructions stored in the computer readable storage medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

With reference now to the figures, and in particular, with reference to FIG. 1, a diagram of a data processing environment is provided in which illustrative embodiments may be implemented. It should be appreciated that FIG. 1 is only meant as an example and is not intended to assert or imply any limitation with regard to environments in which different embodiments may be implemented. Many modifications to the depicted environment may be made.

FIG. 1 depicts a diagram of a data processing system in accordance with an illustrative embodiment. Data processing system 100 is an example of a computer device in which computer readable program code or instructions implementing processes of illustrative embodiments may be located. Data processing system 100 may be, for example, a server computer or a client computer connected to a network, such as a local area network, a wide area network, an intranet, an internet, or the Internet. In this illustrative example, data processing system 100 includes communications fabric 102, which provides communications between processor unit 104, memory 106, persistent storage 108, communications unit 110, input/output (I/O) unit 112, and display 114.

Processor unit 104 serves to execute instructions for software applications or programs that may be loaded into memory 106. Processor unit 104 may be a set of one or more processors or may be a multi-processor core, depending on the particular implementation. Further, processor unit 104 may be implemented using one or more heterogeneous processor systems, in which a main processor is present with secondary processors on a single chip. As another illustrative example, processor unit 104 may be a symmetric multi-processor system containing multiple processors of the same type.

Memory 106 and persistent storage 108 are examples of computer readable storage devices 116. A computer readable storage device is any piece of hardware that is capable of storing information, such as, for example, without limitation, data, computer readable program code in functional form, and/or other suitable information either on a transient basis and/or a persistent basis. Further, a computer readable storage device does not include a propagation medium, such as a signal or carrier wave. Memory 106, in this example, may be a main memory device, such as a dynamic random access memory (DRAM), or any other suitable volatile or non-volatile storage device, of data processing system 100.

Persistent storage 108 may take various forms, depending on the particular implementation. For example, persistent storage 108 may contain one or more devices. For example, persistent storage 108 may be a magnetic hard disc drive (HDD), a flash memory, a rewritable optical disk, a rewritable magnetic tape drive, or some combination of the above. The media used by persistent storage 108 may be removable. For example, a removable hard disc drive may be used for persistent storage 108.

In this example, persistent storage 108 stores imbalanced training data set 118, sample data space 120, expectation maximization algorithm 122, calculated maximum Mahalanobis distance, 124, calculated minimum Mahalanobis distance 126, and ranked distance score buckets 128. Imbalanced training data set 118 represents a set of data that includes highly imbalanced classes of data for a given data domain. For example, imbalanced data set 118 includes majority data class 130 and minority data class 132. Majority data class 130 is a class of data within imbalanced data set 118 that is represented by a relatively large number of known examples. In contrast, minority data class 132 is a class of data within imbalanced data set 118 that is sparely represented by a relatively small number of examples as compared to the number of examples in majority class 130. Alternatively, minority data class 132 may not be represented by any known examples. Also, it should be noted that imbalanced training data set 118 may represent a one class data set. Data processing system 100 utilizes imbalanced training data set 118 to train a multi-class classifier of a supervised machine learning program.

Sample data space 120 represents all possible data values for the given data domain of imbalanced training data set 118. A data domain is any information relating to a particular topic or area of interest. Data processing system 100 generates Gaussian mixture model (GMM) 134 within sample data space 120 using expectation maximization algorithm 122. Gaussian mixture model 134 is a statistical method for clustering data 138 into Gaussian kernels 136. Gaussian kernels 136 represent a set of one or more kernels of clustered data within sample data space 120.

Data 138 may include any type of recorded data within the given data domain. Also, data 138 may include domain knowledge provided by domain experts within the given data domain in addition to the recorded data. Further, data 138 may include artificial data samples generated by data processing system 100 to be included in minority data class 132. Data 138 include labels 140. Each datum in data 138, whether recorded or generated, includes a corresponding label. The label identifies its corresponding datum for clustering by expectation maximization algorithm 122.

Expectation maximization algorithm 122 is a maximum likelihood algorithm that fits Gaussian mixture model 134 to a set of training data, such as imbalanced training data set 118. It should be noted that expectation maximization algorithm 122 may require an a priori selection of the number of Gaussian kernels 136 to initially include within Gaussian mixture model 134.

Calculated maximum Mahalanobis distance 124 is a threshold Mahalanobis distance score with regard to generated data samples within sample data space 120. Calculated minimum Mahalanobis distance 126 is a Mahalanobis distance calculated by data processing system 100 from each generated data sample within sample data space 120 to a center of a closest Gaussian kernel in Gaussian mixture model 134. A Mahalanobis distance is a metric that provides a relative measure of a data point's distance from a common point, such as, for example, a determined center point within a Gaussian kernel. The Mahalanobis distance identifies a degree of similarity between the generated data samples for minority data class 132 and the recorded data samples associated with majority data class 130. For example, the shorter the calculated Mahalanobis distance is from a generated data sample point to a center of a Gaussian kernel of recorded data samples associated with majority data class 130, the higher the likelihood that the generated data sample belongs to majority data class 130 and not to minority data class 132.

If calculated minimum Mahalanobis distance 126 corresponding to a particular generated data sample is equal to or greater than maximum Mahalanobis distance 124, then data processing system 100 will discard or eliminate that particular data sample because that particular data sample is beyond the maximum threshold distance. In other words, data processing system 100 automatically disregards that particular data sample from being considered as a possible candidate data sample for minority class 132. If calculated minimum Mahalanobis distance 126 corresponding to a particular generated data sample is less than maximum Mahalanobis distance 124, then data processing system 100 will store that particular data sample within a corresponding bucket in ranked distance score buckets 128.

Ranked distance score buckets 128 represent a plurality of buckets that store generated data samples based on their respective minimum Mahalanobis distance. Ranked distance score buckets 128 are ranked in descending order from a highest distance score bucket to a lowest distance score bucket. A highest distance score bucket stores generated data samples with a relatively high distance score (i.e., a generated data sample with a long calculated minimum Mahalanobis distance 126). In contrast, a lowest distance score bucket stores generated data samples with a relatively low distance score (i.e., a generated data sample with a short calculated minimum Mahalanobis distance 126).

Each bucket within ranked distance score buckets 128 includes distance score range 142. Distance score range 142 represents a predetermined range of distance scores that will be stored within a particular bucket. In other words, each bucket stores generated data samples having a calculated minimum Mahalanobis distance score within the predetermined range of distance scores associated with that particular bucket.

Communications unit 110, in this example, provides for communication with other data processing systems and computing devices. Communications unit 110 may provide communications through the use of either or both physical and wireless communications links. The physical communications link may utilize, for example, a wire, cable, universal serial bus, or any other physical technology to establish a physical communications link for data processing system 100. The wireless communications link may utilize, for example, shortwave, high frequency, ultra high frequency, microwave, wireless fidelity (Wi-Fi), bluetooth technology, global system for mobile communications (GSM), code division multiple access (CDMA), second-generation (2G), third-generation (3G), fourth-generation (4G), or any other wireless communication technology or standard to establish a wireless communications link for data processing system 100.

Input/output unit 112 allows for the input and output of data with other devices that may be connected to data processing system 100. For example, input/output unit 112 may provide a connection for user input through a keypad, a keyboard, a mouse, and/or some other suitable input device. Display 114 provides a mechanism to display information to a user. In addition, display 114 may provide touch screen capabilities.

Instructions for the operating system, applications, and/or programs may be located in storage devices 116, which are in communication with processor unit 104 through communications fabric 102. In this illustrative example, the instructions are in a functional form on persistent storage 108. These instructions may be loaded into memory 106 for running by processor unit 104. The processes of the different embodiments may be performed by processor unit 104 using computer implemented instructions, which may be located in a main memory, such as memory 106. These instructions are referred to as program code, computer usable program code, or computer readable program code that may be read and run by a processor in processor unit 104. The program code, in the different embodiments, may be embodied on different physical computer readable storage devices, such as memory 106 or persistent storage 108.

Program code 144 is located in a functional form on computer readable media 146 that is selectively removable and may be loaded onto or transferred to data processing system 100 for running by processor unit 104. Program code 144 and computer readable media 146 form computer program product 148. In one example, computer readable media 146 may be computer readable storage media 150 or computer readable signal media 152. Computer readable storage media 150 may include, for example, an optical or magnetic disc that is inserted or placed into a drive or other device that is part of persistent storage 108 for transfer onto a storage device, such as a magnetic hard disc drive, that is part of persistent storage 108. Computer readable storage media 150 also may take the form of a persistent storage device, such as a hard drive, a thumb drive, or a flash memory that is connected to data processing system 100. In some instances, computer readable storage media 150 may not be removable from data processing system 100.

Alternatively, program code 144 may be transferred to data processing system 100 using computer readable signal media 152. Computer readable signal media 152 may be, for example, a propagated data signal containing program code 144. For example, computer readable signal media 152 may be an electro-magnetic signal, an optical signal, and/or any other suitable type of signal. These signals may be transmitted over communication links, such as wireless communication links, an optical fiber cable, a coaxial cable, a wire, and/or any other suitable type of communications link. In other words, the communications link and/or the connection may be physical or wireless in the illustrative examples. The computer readable media also may take the form of non-tangible media, such as communication links or wireless transmissions containing the program code.

In some illustrative embodiments, program code 144 may be downloaded over a network to persistent storage 108 from another device or data processing system through computer readable signal media 152 for use within data processing system 100. For instance, program code stored in a computer readable storage media in a server data processing system may be downloaded over a network from the server to data processing system 100. The data processing system providing program code 144 may be a server computer, a client computer, or some other device capable of storing and transmitting program code 144.

The different components illustrated for data processing system 100 are not meant to provide architectural limitations to the manner in which different embodiments may be implemented. The different illustrative embodiments may be implemented in a data processing system including components in addition to, or in place of, those illustrated for data processing system 100. Other components shown in FIG. 1 can be varied from the illustrative examples shown. The different embodiments may be implemented using any hardware device or system capable of executing program code. As one example, data processing system 100 may include organic components integrated with inorganic components and/or may be comprised entirely of organic components excluding a human being. For example, a storage device may be comprised of an organic semiconductor.

As another example, a computer readable storage device in data processing system 100 is any hardware apparatus that may store data. Memory 106, persistent storage 108, and computer readable storage media 150 are examples of physical computer readable storage devices in a tangible form.

In another example, a bus system may be used to implement communications fabric 102 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 106 or a cache such as found in an interface and memory controller hub that may be present in communications fabric 102.

In order to provide an effective solution for supervised machine learning programs with regard to a highly imbalanced data set or a one class data set, illustrative embodiments generate artificial data samples and inject the generated data samples into a minority class in order to balance the data across the different data classes (i.e., the majority class and the minority class) within the data set. Illustrative embodiments are amenable to parallelization and, therefore, may be used for processing massive data sets on high performance computing platforms.

A key feature of illustrative embodiments consists of generating a constrained Gaussian mixture model of candidate data samples and bucket ranking the candidate data samples to evaluate the usefulness of the candidate data samples. Basically, illustrative embodiments identify a set of data samples that are less likely to be included in the majority data class and let the set of data samples that are less likely to be included in the majority data class represent the data distribution of the minority data class. Illustrative embodiments then balance the existing data and the identified set of data samples. Illustrative embodiments use both the existing data and the identified data to train a multi-class classifier model of a supervised machine learning program. For the sake of simplicity, the discussion of the different illustrative embodiments assumes a two class imbalanced data set, where the minority data class only includes a few data samples or examples. However, it should be noted that the imbalanced data set may include more than two data classes. For example, the imbalanced data set may include a set of one or more majority classes and a set of one or more minority classes.

Illustrative embodiments use the constrained Gaussian mixture model to estimate the data distribution of the majority data class, while using a minority data class to provide the constraints on the Gaussian mixture model. However, it should be noted that illustrative embodiments may utilize a set of one or more minority data classes to provide the constraints on the Gaussian mixture model. In other words, the illustrative embodiments may utilize a plurality of minority data classes to provide the constraints. To estimate the data distribution of the majority data class, illustrative embodiments initialize a Gaussian mixture model and compute the model parameters using an expectation maximization (EM) algorithm. In addition, illustrative embodiments uniformly select a set of data samples from a feasible sample space. Further, illustrative embodiments consider the constraints that arise from the set of minority data classes. If data samples from a minority class show a high likelihood to be included in the data distribution of the majority class estimated by the Gaussian mixture model, illustrative embodiments increase the number of Gaussian kernels of the Gaussian mixture model to improve the data distribution estimate.

After illustrative embodiments determine the estimated data distribution of the majority data class, illustrative embodiments then evaluate the candidacy of the generated data samples. Illustrative embodiments score each generated data sample according to its distance to the estimated data distribution of the majority class. In other words, illustrative embodiments score each generated data sample by measuring a minimum Mahalanobis distance from a generated data sample to a center of a nearest Gaussian kernel of the Gaussian mixture model. The Mahalanobis distance considers the influence of covariance.

Illustrative embodiments rank the generated data samples according to their respective distance scores. Illustrative embodiments discard or eliminate those generated data samples with low distance scores. The generated data samples with low scores are data samples that are too close to the majority data class distribution and, therefore, are more likely to be included in the majority data class and less likely to be included in the minority data class. Illustrative embodiments utilize bucket ranking to reduce complexity and make illustrative embodiments suitable for parallelization.

In contrast to down data sampling methods, illustrative embodiments are able to work on highly imbalanced data sets and on one class data sets. Down data sampling is the process of balancing data across classes by reducing the number of data samples in the majority data class. However, illustrative embodiments do not discard any of the existing known data from the training data set. In contrast to traditional one data class problems, illustrative embodiments consider the constraints due to the known data in the minority class and automatically determine the appropriate number of Gaussian kernels within a Gaussian mixture model based on the constraints. This ensures that illustrative embodiments will not ignore any known anomalies in the data of the minority class. In summary, compared to known techniques, illustrative embodiments efficiently leverage known data and enable parallelization. Therefore, illustrative embodiments are able to increase the performance of multi-class classifier models in supervised machine learning programs.

Thus, illustrative embodiments of the present invention provide a computer-implemented method, computer system, and computer program product for determining a number of kernels within a model. It should be noted that in the description of the different illustrative embodiments, data samples within the minority data class or data samples that are being injected into the minority data class are known as positive data samples. Also, data samples within the majority data class are known as negative data samples. In response to a computer receiving an input to balance the imbalanced training data set that includes the majority data class and the minority data class, the computer generates a set of positive data samples for the minority data class of the imbalanced training data set. The computer calculates a distance from each data sample in the set of positive data samples to a center of a kernel that includes a set of negative data samples of the majority data class. The computer stores each data sample in the set of positive data samples within a corresponding distance score bucket based on the calculated distance of a data sample. The computer selects positive data samples from a predetermined number of highest ranking distance score buckets. The computer injects the positive data samples selected from the predetermined number of highest ranking distance score buckets into the minority data class to balance a number of positive data samples in the minority data class with a number of negative data samples in the majority data class.

The computer determines a number of kernels that include data samples of the majority data class of the imbalanced training data set based on the set of generated artificial data samples for a minority data class of the imbalanced training data set. The computer generates the number of kernels within the model based on the set of generated artificial data samples. The computer calculates a likelihood of the set of generated artificial data samples being included in the majority data class of the imbalanced training data set. The computer updates parameters of each kernel in the number of kernels based on the likelihood of the set of generated artificial data samples being included in the majority data class of the imbalanced training data set. The computer adjusts each kernel in the number of kernels based on the updated parameters.

Figure 2:
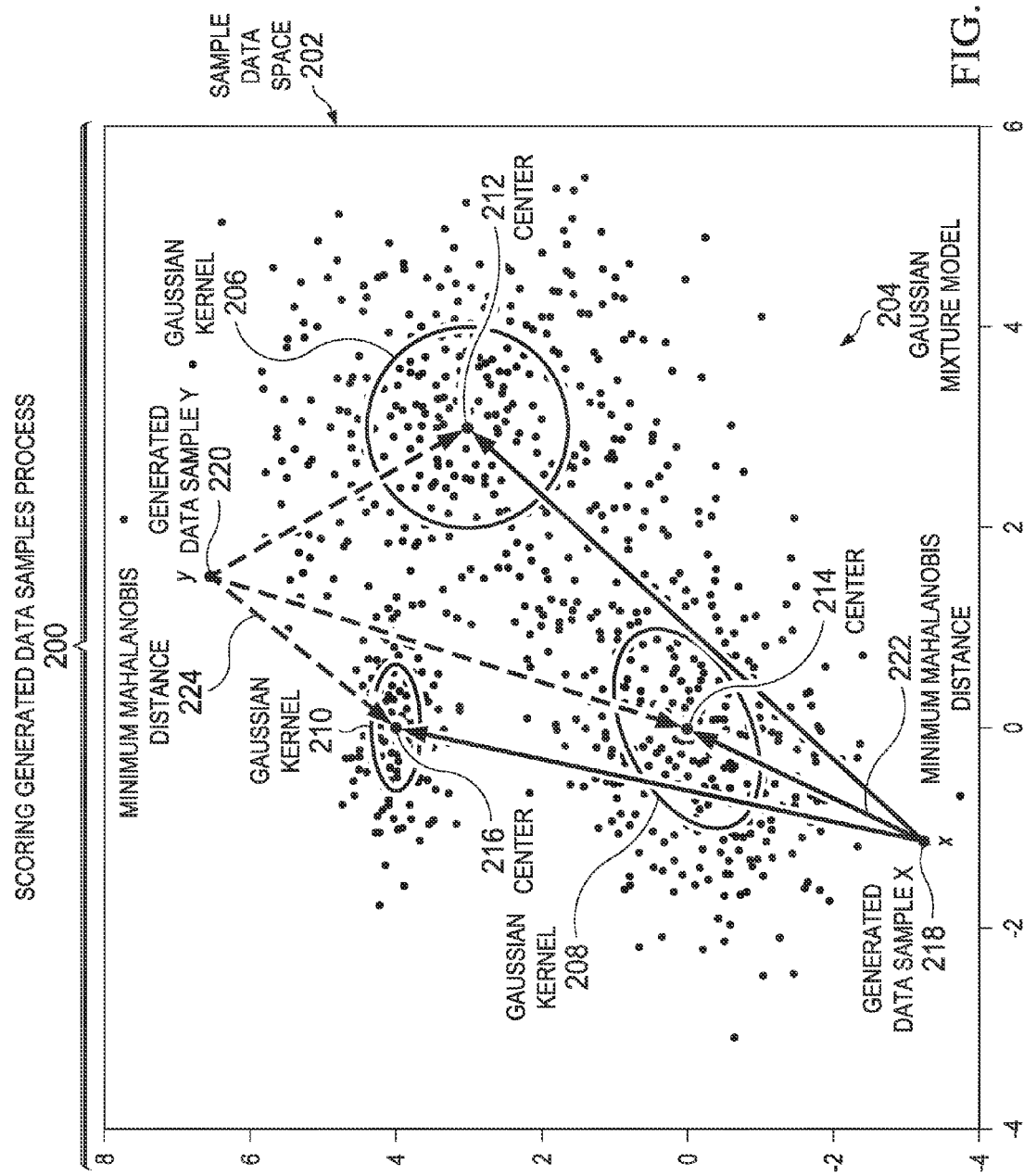
FIG. 2 is a diagram illustrating an example of scoring data samples in accordance with an illustrative embodiment.

With reference now to FIG. 2, a diagram illustrating an example of scoring data samples is depicted in accordance with an illustrative embodiment. Scoring generated data samples process 200 may be implemented in a computer, such as data processing system 100 in FIG. 1. Scoring generated data samples process 200 is a process of calculating distance scores for generated data samples.

In this example, scoring generated data samples process 200 utilizes sample data space 202, such as sample data space 120 in FIG. 1. Sample data space 202 represents all possible data values for a given data domain. Sample data space 202 includes Gaussian mixture model 204, such as Gaussian mixture model 134 in FIG. 1. The computer utilizes an expectation maximization algorithm, such as expectation maximization algorithm 122 in FIG. 1, to estimate the distribution of a majority data class of an imbalanced training data set using Gaussian mixture model 204 with three Gaussian kernels (i.e., Gaussian kernel 206, Gaussian kernel 208, and Gaussian kernel 210). The majority data class of the imbalanced training data set may be, for example, majority data class 130 of imbalanced training data set 118 in FIG. 1.

Also in this example, the computer samples generated data sample X 218 and generated data sample Y 220 as candidate data samples for a minority data class, such as minority data class 132 in FIG. 1. For each candidate data sample, the computer draws arrows from a particular candidate data sample to each Gaussian kernel center, such as center 212, center 214, and center 216. The computer calculates the distance using the Mahalanobis distance to take into account the data distribution.

The computer uses minimum Mahalanobis distance 222 to center 214 of Gaussian kernel 208 as the distance score for candidate generated data sample X 218. Similarly, the computer uses minimum Mahalanobis distance 224 to center 216 of Gaussian kernel 210 as the distance score for candidate generated data sample Y 220. The computer continues to calculate distance scores for other candidate data samples in sample data space 202. Then, the computer ranks each of the candidate data samples based on their respective distance scores and eliminates those candidate data samples with low distance scores because candidate data samples with low distance scores are less likely to be included in the minority data class and more likely to be included in the majority data class.

The computer ranks all the candidate data samples by placing the candidate data samples into corresponding buckets based on the calculated distance scores associated with each candidate data sample. Bucket ranking provides a fast sorting mechanism for candidate data samples in parallel. The computer then selects candidate data samples from a top number of buckets storing candidate data samples with the highest distance scores. However, it should be noted that illustrative embodiments are not limited to ranking candidate data samples using buckets. In other words, bucket ranking is just one possible way for an illustrative embodiment to rank the candidate data samples. Alternative illustrative embodiments may utilize other data ranking methods to rank the candidate data samples for later selection.

Afterward, the computer injects the candidate data samples selected from the top number of buckets into the minority class to balance the number of data samples in the minority data class with the number of data samples in the majority data class without downsizing the number of data samples in the majority data class. Further, the computer does not modify or replace any labels of existing data samples in the training data set. The computer gives labels to all data samples and the given labels are correct. The output is a labeled and balanced dataset ready for classification.

It should be noted that the computer may generate the candidate data samples from the imbalanced training data set. The computer may utilize a hybrid approach to generate the candidate data samples using recorded statistical data for a given data domain and domain knowledge. Domain knowledge is defined as a set of data representing a class of data with very little or no data (i.e., a minority data class). If data does exist for the minority data class, then the known data may serve as domain knowledge. If data does not exist for the minority data class, then domain experts provide the domain knowledge. For example, in the application of brain signal classification, medical doctors may provide the domain knowledge of brain signals pathognomonic of a particular brain disease.

Also it should be noted that the computer may utilize a pre-computed maximum Mahalanobis distance, such as calculated maximum Mahalanobis distance 124 in FIG. 1. The maximum Mahalanobis distance serves as a threshold distance score value. For example, if a candidate data sample has a calculated distance score equal to or greater than the pre-computed maximum Mahalanobis distance, then the computer will not place that particular data sample into a bucket. In other words, the computer will not consider that particular data sample as a candidate for inclusion in the minority data class.

Further, given the pre-computed maximum Mahalanobis distance, the computer generates a predetermined number of buckets for storing the candidate data samples. Each bucket in the predetermined number of generated buckets represents a range of distance scores associated with candidate data samples. For example, the computer stores a candidate data sample within a corresponding bucket based on the candidate data sample's distance score falling within the range of distance scores assigned to that bucket. Illustrative embodiments may store the candidate data samples in the number of buckets in parallel.

Furthermore, the computer determines the number of negative data samples in the majority data class. The computer then selects the positive candidate data samples from the top number of buckets so that the number of positive candidate data samples is less than the determined number of negative data samples in the majority data class, while the positive candidate data samples in a next bucket outside the top number of buckets will make the number of positive candidate data samples greater that the determined number of negative data samples. The computer selects a number of positive candidate data samples from the next bucket, where the number of positive data samples selected from the next bucket is equal to a difference between the determined number of negative data samples in the majority data class and the number of positive candidate data samples from the top number of buckets. For example, assume that the determined number of negative data samples in the majority data class is 100 and that the number of positive candidate data samples in the top number of buckets is 99. Consequently, the computer selects one (1) more positive candidate data sample from the next bucket adjacent to the top number of buckets to make 100 positive candidate data samples for the minority data class. Thus, the computer balances the number of negative data samples in the majority data class (100) with the number of positive data samples for the minority data class (100).

Figure 3:
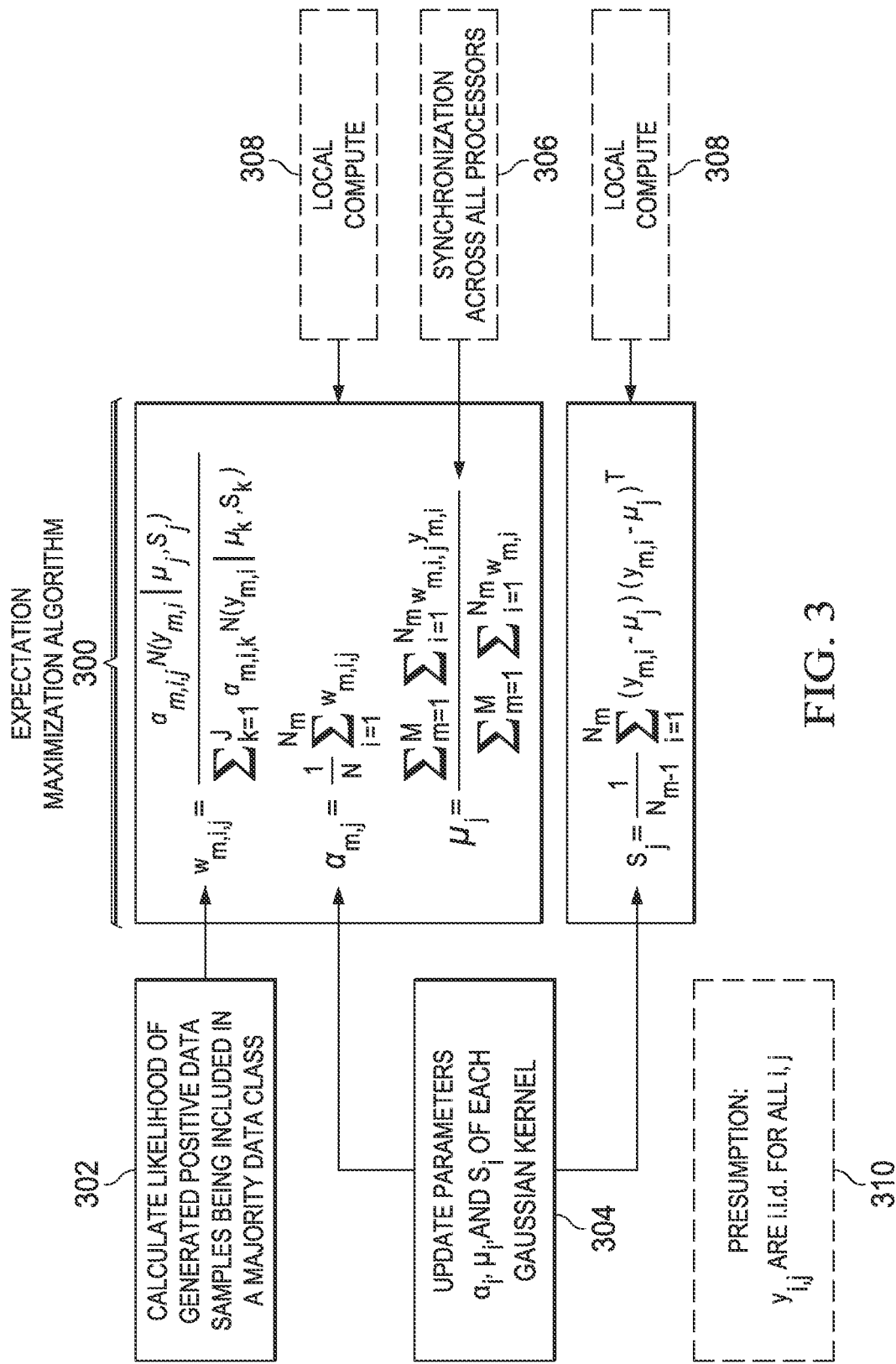
FIG. 3 is a diagram illustrating an example of an expectation maximization algorithm for estimating parameters of a Gaussian mixture model in parallel in accordance with an illustrative embodiment.

With reference now to FIG. 3, a diagram illustrating an example of an expectation maximization algorithm for estimating parameters of a Gaussian mixture model in parallel is depicted in accordance with an illustrative embodiment. Expectation maximization algorithm 300 may be, for example, expectation maximization algorithm 122 in FIG. 1. The Gaussian mixture model may be, for example, Gaussian mixture model 204 in FIG. 2.

Expectation maximization algorithm 300 includes mathematical formula 302 that calculates a likelihood of generated positive data samples being included in a majority data class, such as majority data class 130 in FIG. 1. In addition, expectation maximization algorithm 300 also includes mathematical formulas 304 that update the parameters of each Gaussian kernel within the Gaussian mixture model, such as Gaussian kernels 206, 208, and 210 in FIG. 2. The parameters of the Gaussian kernels may be, for example, a size of a Gaussian kernel, a mean vector to a Gaussian kernel, a covariance matrix within a Gaussian kernel, et cetera. Further, expectation maximization algorithm 300 includes mathematical formula 306 for synchronization across all processors. It should be noted that local compute 308 may be performed on a number of remote computers connected via a network. Also it should be noted at presumption 310 that $y_{i,j}$ in mathematical formulas 302, 304, and 306 are independent and identically distributed (i.i.d.) random variables for all i and j.

Expectation maximization algorithm 300 is a modified expectation maximization algorithm for Gaussian mixture model parameter learning because the computer uses known data samples from the minority data class to see whether the computer needs to update or change the number of Gaussian kernels within the Gaussian mixture model. If a minority data sample shows a high likelihood with respect to the distribution of the data from the majority data class, then the computer determines that to be a violation of the constraints on the Gaussian mixture model. In this case, the computer increases the number of Gaussian kernels so that the computer may have more Gaussian kernels to improve the data distribution. Expectation maximization algorithm 300 shows a way to update the parameters in parallel, assuming the data are distributed across a number of processors on different computing sites with a number of data.

Figure 4B:
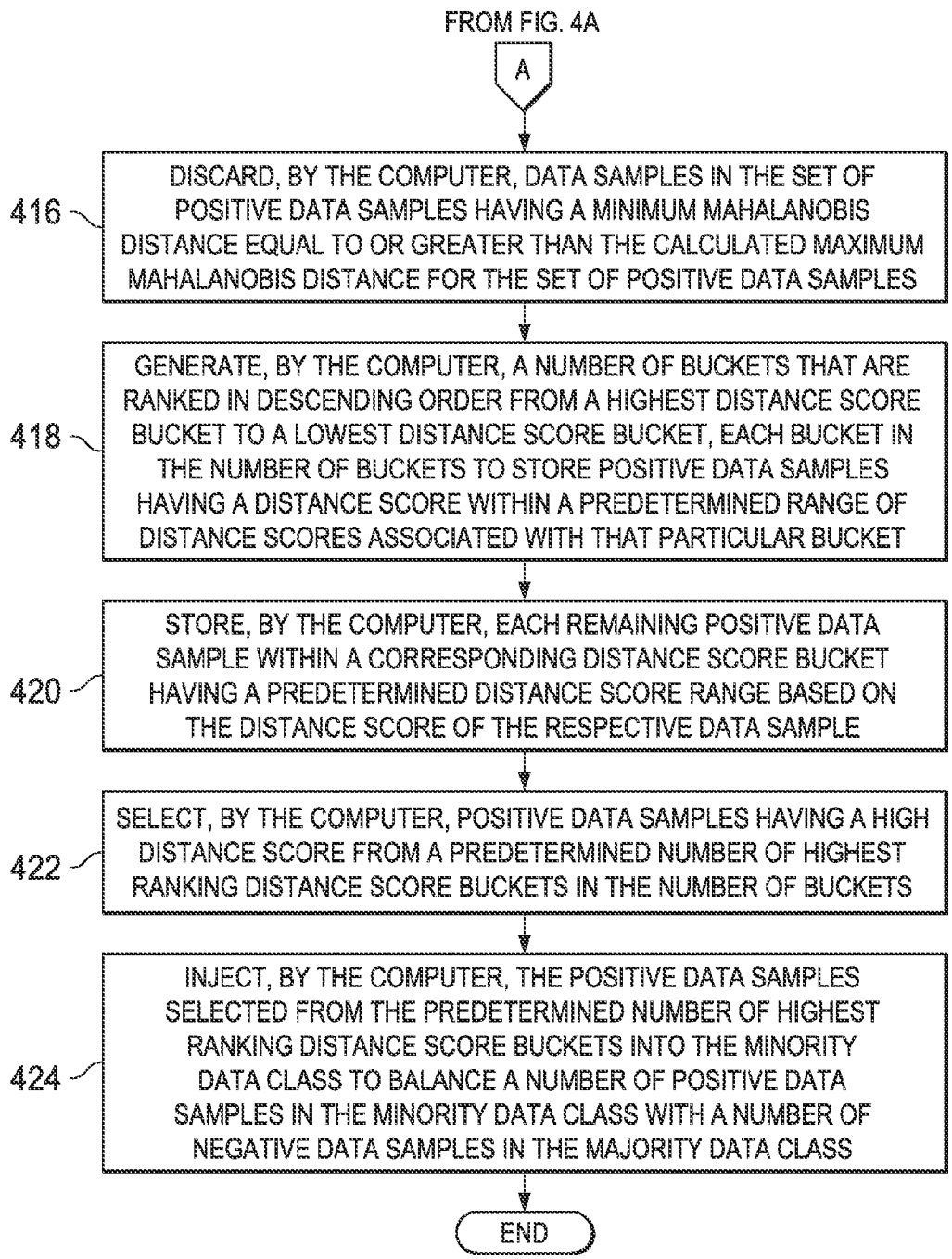

With reference now to FIGS. 4A-4B, a flowchart illustrating a process for injecting generated data samples into a minority data class to balance an imbalanced training data set is shown in accordance with an illustrative embodiment. The process shown in FIGS. 4A-4B may be implemented in a computer, such as, for example, data processing system 100 in FIG. 1.

The process begins when the computer receives an input to balance an imbalanced training data set that includes a majority data class and a minority data class, such as imbalanced training data set 118 that includes majority data class 130 and minority data class 132 in FIG. 1 (step 402). Afterward, the computer generates a set of positive data samples for the minority data class of the imbalanced training data set (step 404). The computer may draw positive data samples from a data distribution that covers a feasible sample space, such as sample data space 202 in FIG. 2. The number of positive data samples drawn from the data distribution plus known data samples from the minority class is more than the number of negative data samples in the majority class because the computer will discard some of the positive data samples.

In addition, the computer utilizes an expectation maximization algorithm to determine a Gaussian mixture model that includes a number of Gaussian kernels comprising negative data samples of the majority data class of the imbalanced training data set (step 406). The expectation maximization algorithm may be, for example, expectation maximization algorithm 300 in FIG. 3. The Gaussian mixture model that includes the number of Gaussian kernels comprising negative data samples of the majority data class may be, for example, Gaussian mixture model 204 that includes Gaussian kernels 206, 208, and 210 in FIG. 2. The computer uses the expectation maximization algorithm to estimate the Gaussian mixture model and uses the known data samples from the minority data class to constrain the Gaussian mixture model. In particular, the computer leverages the known data samples from the minority data class to calculate the appropriate number of Gaussian kernels to be included in the Gaussian mixture model.

The computer also calculates a maximum Mahalanobis distance, such as calculated maximum Mahalanobis distance 124 in FIG. 1, for the set of positive data samples (step 408). Further, the computer calculates a Mahalanobis distance from each data sample in the set of positive data samples to a center of each of the number of Gaussian kernels, such as center 212, 214, and 216 in FIG. 2, within the Gaussian mixture model (step 410). Then, the computer determines a minimum Mahalanobis distance from each data sample in the set of positive data samples to the center of a nearest Gaussian kernel in the number of Gaussian kernels (step 412). The minimum Mahalanobis distance may be, for example, calculated minimum Mahalanobis distance 126 in FIG. 1. The scoring method may be expressed as, for example:

$$\text{Score}(x) = \min_{j=1}^{J} d_M(x, \mu_j) = \min_{j=1}^{J} \sqrt{(x - \mu_j)^T S_j^{-1} (x - \mu_j)},$$

where x is the positive data sample to score; J is the number of Gaussian kernels to be included in the Gaussian mixture model; and $\mu_j$ and $S_j$ are the mean vector parameter and the covariance matrix parameter, respectively, for each Gaussian kernel.

The computer utilizes the minimum Mahalanobis distance corresponding to each data sample in the set of positive data samples as a distance score for a respective data sample (step 414). Subsequently, the computer discards data samples in the set of positive data samples having a minimum Mahalanobis distance equal to or greater than the calculated maximum Mahalanobis distance for the set of positive data samples (step 416). In addition, the computer generates a number of buckets that are ranked in descending order from a highest distance score bucket to a lowest distance score bucket, each bucket in the number of buckets to store positive data samples having a distance score within a predetermined range of distance scores associated with that particular bucket (step 418). The number of buckets that are ranked in descending order may be, for example, ranked distance score buckets 128 in FIG. 1. The predetermined range of distance scores associated with a particular bucket may be, for example, distance score range 142 in FIG. 1.

Afterward, the computer stores each remaining positive data sample within a corresponding distance score bucket having a predetermined distance score range based on the distance score of the respective data sample (step 420). Then, the computer selects positive data samples having a high distance score from a predetermined number of highest ranking distance score buckets in the number of buckets (step 422). Further, the computer injects the positive data samples selected from the predetermined number of highest ranking distance score buckets into the minority data class to balance a number of positive data samples in the minority data class with a number of negative data samples in the majority data class (step 424). Thereafter, the process terminates.

Figure 5:
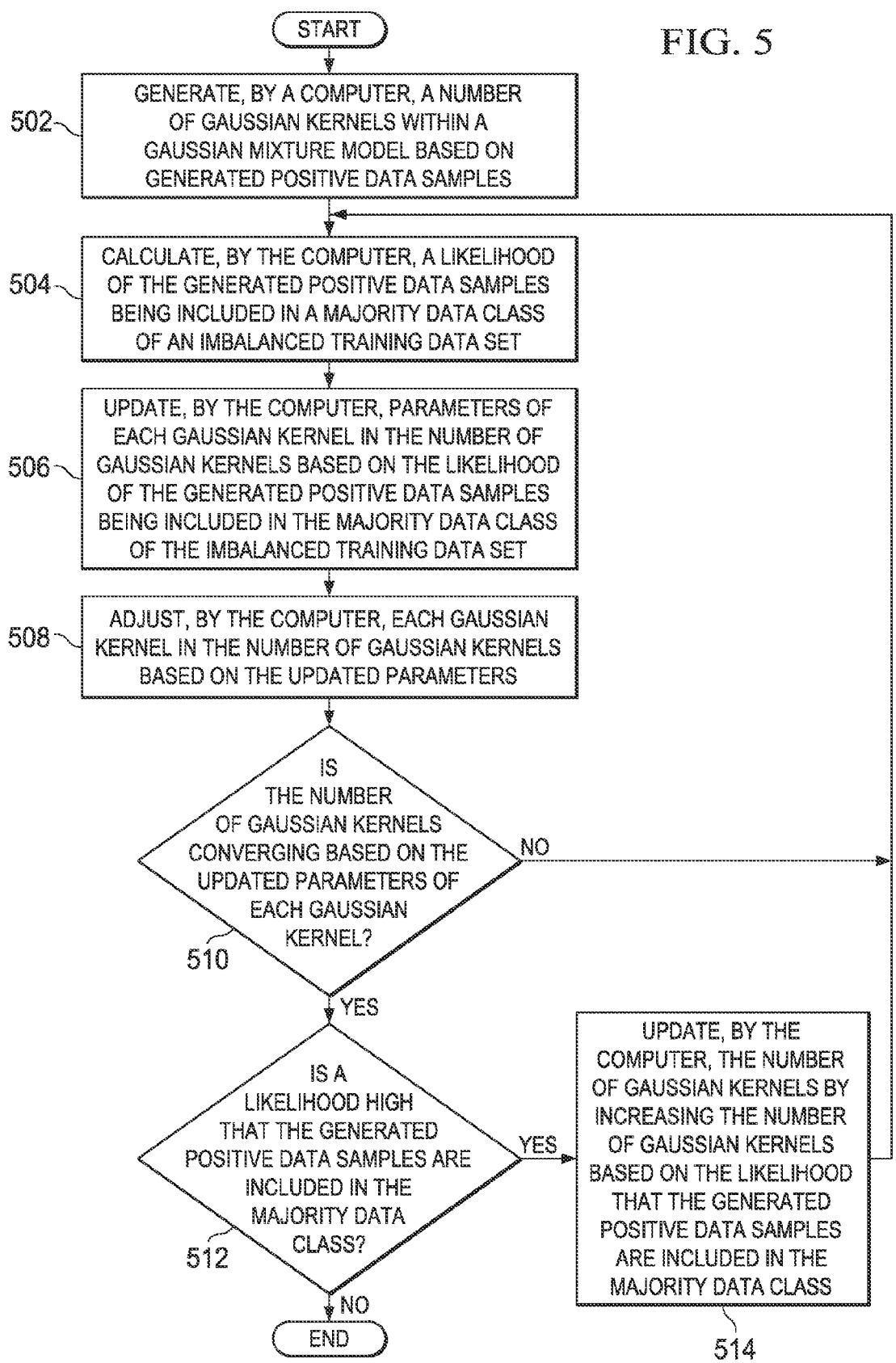
FIG. 5 is a flowchart illustrating a process for determining a number of Gaussian kernels within a Gaussian mixture model in accordance with an illustrative embodiment.

With reference now to FIG. 5, a flowchart illustrating a process for determining a number of Gaussian kernels within a Gaussian mixture model is shown in accordance with an illustrative embodiment. The process shown in FIG. 5 may be implemented in a computer, such as, for example, data processing system 100 in FIG. 1. In addition, the process shown in FIG. 5 may be implemented in step 406 of FIG. 4.

The process begins when the computer generates a number of Gaussian kernels within a Gaussian mixture model based on generated positive data samples (step 502). The number of Gaussian kernels within the Gaussian mixture model may be, for example, Gaussian kernels 206, 208, and 210 within Gaussian mixture model 204 in FIG. 2. In addition, the computer calculates a likelihood of the generated positive data samples being included in a majority data class of an imbalanced training data set (step 504). For example, the computer uses mathematical formula 302 in FIG. 3 to calculate the likelihood of a generated positive data sample being included in a majority data class.

Further, the computer updates parameters of each Gaussian kernel in the number of Gaussian kernels based on the likelihood of the generated positive data samples being included in the majority data class of the imbalanced training data set (step 506). For example, the computer uses mathematical formulas 304 in FIG. 3 to update the parameters of each Gaussian kernel. Then, the computer adjusts each Gaussian kernel in the number of Gaussian kernels based on the updated parameters (step 508). Afterward, the computer makes a determination as to whether the number of Gaussian kernels is converging based on the updated parameters of each Gaussian kernel (step 510).

If the computer determines that the number of Gaussian kernels is not converging based on the updated parameters of each Gaussian kernel, no output of step 510, then the process returns to step 504 where the computer again calculates the likelihood of the generated positive data samples being included in the majority data class. If the computer determines that the number of Gaussian kernels is converging based on the updated parameters of each Gaussian kernel, yes output of step 510, then the computer makes a determination as to whether a likelihood is high that the generated positive data samples are included in the majority data class (step 512). If the computer determines that the likelihood is high that the generated positive data samples are included in the majority data class, yes output of step 512, then the computer updates the number of Gaussian kernels by increasing the number of Gaussian kernels based on the likelihood that the generated positive data samples are included in the majority data class (step 514). Thereafter, the process returns to step 504 where the computer again calculates the likelihood of the generated positive data samples being included in the majority data class. If the computer determines that the likelihood is low that the generated positive data samples are included in the majority data class, no output of step 512, then the process terminates thereafter.

Thus, illustrative embodiments provide a computer-implemented method, computer program product, and computer system for injecting generated data samples into a minority data class to balance an imbalanced training data set. The descriptions of the various illustrative embodiments have been presented for purposes of illustration, but are not intended to be exhaustive or limited to the embodiments disclosed. Many modifications and variations will be apparent to those of ordinary skill in the art without departing from the scope and spirit of the described embodiment. The terminology used herein was chosen to best explain the principles of the embodiment, the practical application or technical improvement over technologies found in the marketplace, or to enable others of ordinary skill in the art to understand the embodiments disclosed here.

The flowchart and block diagrams in the figures illustrate the architecture, functionality, and operation of possible implementations of computer systems, computer implemented methods, and computer program products according to various illustrative embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A computer-implemented method to determine a number of kernels within a model for balancing training data using machine learning, the computer-implemented method comprising:
   receiving, by a computer, an input to balance an imbalanced training data set that includes a majority data class and a minority data class;
   determining, by the computer, the number of kernels that include data samples of the majority data class of the imbalanced training data set based on a set of generated artificial data samples for the minority data class of the imbalanced training data set;
   labeling each datum in the majority data class and the minority data class with a corresponding label that identifies corresponding datum for clustering by an expectation maximization algorithm;
   generating, by the computer, the model of an estimated data distribution of recorded negative data samples associated with the majority data class of the imbalanced training data set including the set of generated artificial data samples selectively injected into the minority data class as positive data samples to constrain the model and balance the imbalanced training data set across different data classes of the majority data class and the minority data class of the imbalanced training data set, the model including the number of kernels representing a set of one or more kernels of clustered data within a sample data space;
   calculating, by the computer using predetermined criteria, a likelihood that the positive data samples are included in negative data samples of the majority data class of the imbalanced training data set, wherein a set of positive data samples that is less likely to be included in the negative data samples of the majority data class represents a data distribution of the minority data class selectively injected by the computer to balance a number of positive data samples in the minority data class with a number of negative data samples in the majority data class to form labeled and balanced training data that train a multi-class classifier model;
   updating, by the computer, parameters of each kernel in the number of kernels in parallel using the expectation maximization algorithm, based on the set of positive data samples calculated less likely to be included in the negative data samples of the majority data class; adjusting, by the computer, each kernel in the number of kernels based on the parameters updated while maintaining existing known data of the majority data class of the imbalanced training data set; and
   training, by the computer using the labeled and balanced training data, the multi-class classifier model of a supervised machine learning program of a system.

2. The computer-implemented method of claim 1, further comprising:
   responsive to the computer determining that the likelihood of the set of generated artificial data samples for the minority data class being included in the majority data class is high, increasing, by the computer, the number of kernels within the model.

3. The computer-implemented method of claim 1, wherein a set of minority data classes of the imbalanced training data set provide constraints on the model.

4. The computer-implemented method of claim 1, wherein the model is a Gaussian mixture model, and wherein the expectation maximization algorithm is a modified expectation maximization algorithm for Gaussian mixture model parameter learning.

5. A computer system to determine a number of kernels within a model for balancing training data using machine learning, the computer system comprising:
   a bus system;
   a storage device connected to the bus system, wherein the storage device stores computer readable program code; and
   a processor unit connected to the bus system, wherein the processor unit executes the computer readable program code to:
   receive an input to balance an imbalanced training data set that includes a majority data class and a minority data class;
   determine the number of kernels that include data samples of the majority data class of the imbalanced training data set based on a set of generated artificial data samples for the minority data class of the imbalanced training data set;
   label each datum in the majority data class and the minority data class with a corresponding label that identifies corresponding datum for clustering by an expectation maximization algorithm;
   generate the model of an estimated data distribution of recorded negative data samples associated with the majority data class of the imbalanced training data set including the set of generated artificial data samples selectively injected into the minority data class as positive data samples to constrain the model and balance the imbalanced training data set across different data classes of the majority data class and the minority data class of the imbalanced training data set, the model including the number of kernels representing a set of one or more kernels of clustered data within a sample data space;
   calculate using predetermined criteria a likelihood that the positive data samples are included in the recorded negative data samples of the majority data class of the imbalanced training data set, wherein a set of positive data samples that is less likely to be included in negative data samples of the majority data class represents a data distribution of the minority data class selectively injected to balance a number of positive data samples in the minority data class with a number of the recorded negative data samples in the majority data class to form labeled and balanced training data that train a multi-class classifier model;

update parameters of each kernel in the number of kernels in parallel, using the expectation maximization algorithm, based on the set of positive data samples calculated less likely to be included in the recorded negative data samples of the majority data class;

adjust each kernel in the number of kernels based on the parameters updated while maintaining existing known data of the majority data class of the imbalanced training data set; and train, the multi-class classifier model of a supervised machine learning program of a system using the labeled and balanced training data.

6. The computer system of claim 5, wherein the processor unit further executes the computer readable program code to:

increase the number of kernels within the model in response to determining that the likelihood of the set of generated artificial data samples for the minority data class being included in the majority data class is high.

7. The computer system of claim 5, wherein a set of minority data classes of the imbalanced training data set provide constraints on the model.

8. The computer system of claim 5, wherein the model is a Gaussian mixture model, and wherein the expectation maximization algorithm is a modified expectation maximization algorithm for Gaussian mixture model parameter learning.

9. A computer program product stored on a non-transitory computer readable storage medium having computer readable program code encoded thereon that is executable by a computer to determine a number of kernels within a model for balancing training data using machine learning, the computer program product comprising:

computer readable program code to receive an input to balance an imbalanced training data set that includes a majority data class and a minority data class;

computer readable program code to determine the number of kernels that include data samples of the majority data class of the imbalanced training data set based on a set of generated artificial data samples for the minority data class of the imbalanced training data set;

computer readable program code to label each datum in the majority data class and the minority data class, with a corresponding label that identifies corresponding datum for clustering by an expectation maximization algorithm;

computer readable program code to generate the model of an estimated data distribution of recorded negative data samples associated with the majority data class of the imbalanced training data set including the set of generated artificial data samples selectively injected into the minority data class as positive data samples to constrain the model and balance the imbalanced training data set across different data classes of the majority data class and the minority data class of the imbalanced training data set, the model including the number of kernels representing a set of one or more kernels of clustered data within a sample data space;

computer readable program code to calculate using predetermined criteria a likelihood that the positive data samples are included in the recorded negative data samples of the majority data class of the imbalanced training data set, wherein a set of positive data samples that is less likely to be included in recorded negative data samples of the majority data class represents a data distribution of the minority data class selectively injected to balance a number of positive data samples in the minority data class with a number of recorded negative data samples in the majority data class to form labeled and balanced training data for training a multi-class classifier model;

computer readable program code to update parameters of each kernel in the number of kernels in parallel, using the expectation maximization algorithm, based on the set of positive data samples calculated less likely to be included in the recorded negative data samples of the majority data class;

computer readable program code to adjust each kernel in the number of kernels based on the parameters updated while maintaining existing known data of the majority data class of the imbalanced training data set; and computer readable program code to train the multi-class classifier model of a supervised machine learning program of a system using the labeled and balanced training data.

10. The computer program product of claim 9, further comprising:

computer readable program code to increase the number of kernels within the model in response to determining that the likelihood of the set of generated artificial data samples for the minority data class being included in the majority data class is high.

11. The computer program product of claim 9, wherein a set of minority data classes of the imbalanced training data set provide constraints on the model.

12. The computer program product of claim 9, wherein the model is a Gaussian mixture model, and wherein the expectation maximization algorithm is a modified expectation maximization algorithm for Gaussian mixture model parameter learning.

* * * * *